(12) United States Patent
Hynecek et al.

(10) Patent No.: US 9,991,306 B2
(45) Date of Patent: Jun. 5, 2018

(54) HYBRID BONDED IMAGE SENSOR AND METHOD OF OPERATING SUCH IMAGE SENSOR

(71) Applicant: SEMICONDUCTOR COMPONENTS INDUSTRIES, LLC, Phoenix, AZ (US)

(72) Inventors: Jaroslav Hynecek, Allen, TX (US); Vladimir Korobov, San Mateo, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 27 days.

(21) Appl. No.: 15/154,739

(22) Filed: May 13, 2016

(65) Prior Publication Data

US 2017/0170223 A1  Jun. 15, 2017

Related U.S. Application Data

(60) Provisional application No. 62/265,471, filed on Dec. 10, 2015.

(51) Int. Cl.
| | |
|---|---|
| *H01L 27/146* | (2006.01) |
| *H04N 5/378* | (2011.01) |
| *H04N 5/3745* | (2011.01) |

(52) U.S. Cl.
CPC .... *H01L 27/14634* (2013.01); *H01L 27/1464* (2013.01); *H01L 27/1469* (2013.01); *H01L 27/14636* (2013.01); *H01L 27/14641* (2013.01); *H01L 27/14643* (2013.01); *H01L 27/14689* (2013.01); *H04N 5/378* (2013.01); *H04N 5/3745* (2013.01)

(58) Field of Classification Search
CPC .......................... H01L 27/14634; H04N 5/378
See application file for complete search history.

(56) References Cited

U.S. PATENT DOCUMENTS

| | | | |
|---|---|---|---|
| 2014/0054443 A1* | 2/2014 | Faramarzpour ...... | H04N 5/3743 250/208.1 |
| 2014/0211056 A1* | 7/2014 | Fan .................... | H01L 27/14643 348/308 |

OTHER PUBLICATIONS

P. R. Rao et al., "Monolithic and Fully-Hybrid Backside Illuminated CMOS Imagers for Smart Sensing," Proceedings of SPIE—The International Society for Optical Engineering, Sep. 2009, 4 pages.

\* cited by examiner

*Primary Examiner* — Christopher K Peterson
(74) *Attorney, Agent, or Firm* — Polansky & Associates, P.L.L.C.; Paul J. Polansky (57) ABSTRACT

In one form, a hybrid bonded image sensor comprises a photodiode chip, a circuit carrying chip, and an interconnection. The photodiode chip provides charge to a first floating diffusion in response to incident light, wherein the first floating diffusion is coupled to a first terminal on a first surface of the photodiode chip. The circuit carrying chip has a first terminal aligned with the first terminal of the photodiode chip, the circuit carrying chip forming an output voltage based on charge transferred on the first floating diffusion sensed from the first terminal thereof. The interconnection connects the first terminal of the photodiode chip to the first terminal of the circuit carrying chip.

20 Claims, 7 Drawing Sheets

HYBRID BONDED IMAGE SENSOR AND METHOD OF OPERATING SUCH IMAGE SENSOR

CROSS-REFERENCE TO RELATED APPLICATION(S)

This application claims priority to U.S. Provisional Application No. 62/265,471, filed on Dec. 10, 2015, entitled "Hybrid Bonded Image Sensor and Method of Operating Such Image Sensor," invented by Jaroslav Hynecek and Vladimir Korobov, and is incorporated herein by reference and priority thereto for common subject matter is hereby claimed.

FIELD OF THE DISCLOSURE

The present disclosure relates generally to image sensors, and more particularly to hybrid bonded image sensors using multiple chips.

BACKGROUND

Electronic image sensors are found in a variety of useful products, including cameras, camcorders, cell phones, medical devices, machine vision instruments, and the like. Image sensors have a characteristic dynamic range. Typical image sensors sense light by converting impinging photons into electrons that are integrated (collected) in sensor pixels. After completion of an integration cycle, the collected charge is converted into a voltage and supplied to an output terminal of the image sensor.

For example in complementary metal-oxide-semiconductor (CMOS) image sensors the pixels themselves perform the charge-to-voltage conversion to form an analog pixel voltage. The image sensor transfers the analog pixel voltage to the output terminal using various pixel addressing and scanning schemes. The image sensor can also convert the analog signal to a digital equivalent on-chip before reaching the chip output. Typical CMOS sensor pixels incorporate a buffer amplifier, typically a source follower (SF), which drives the sense lines that are connected to the pixels when selected by suitable addressing transistors. After the charge-to-voltage conversion is completed and the resulting signal transferred out from the pixels, the pixels are reset in order to be ready for accumulation of new charge packets. In a pixel that uses a floating diffusion (FD) as a charge detection node, the reset is accomplished by turning on a reset transistor that conductively connects the FD node to a voltage reference, which is typically the pixel drain node. The reset step removes collected charge, but in the process generates noise known as kTC-reset noise, as is well known in the art. Known CMOS image sensors remove the kTC-reset noise by using the correlated double sampling (CDS) signal processing technique in order to achieve the desired low noise performance. Typical CMOS image sensors that utilize the CDS technique usually require three or four transistors (4T) within each pixel. An example of the 4T pixel circuit with the pinned photodiode can be found in the U.S. Pat. No. 5,625,210 to Lee.

In the previous art the pixel circuits that consist of components such as the source follower transistor, the reset transistor, and the addressing transistor were all placed on the same substrate with the photodiodes. Also all the signal processing circuits, including the CDS and ADC circuits, were placed on the same substrate. This degree of integration presented some limitations and barriers for further sensor performance improvements. Recently, however, a significant progress has been made that allows now a direct chip-to-chip bonding with small metal pad interconnects. The pad-to-pad bonding can be performed for each pixel, or a group of several pixels sharing the same bonding pad, of the image sensor array. This concept is called the Hybrid Chip Stacking Technology (HCS) and this technology development now allows placing the light sensing photodiodes on the one chip and the remaining pixel circuits on another chip that is attached below the chip that is sensing light.

This disclosure, therefore, describes the pixels of photodiode arrays that are suitable for the BSI applications, which can be attached using the HCS technology, to a carrier chip that includes the pixel like circuit cells and the remaining signal processing circuitry. The chip-to-chip connections are performed at the Floating Diffusion (FD) node level, which presents some challenges related to the increased node parasitic bonding pad capacitance, the pixel to pixel uniformity and kTC reset noise. Possible solutions to these challenges are the topic of this patent disclosure.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
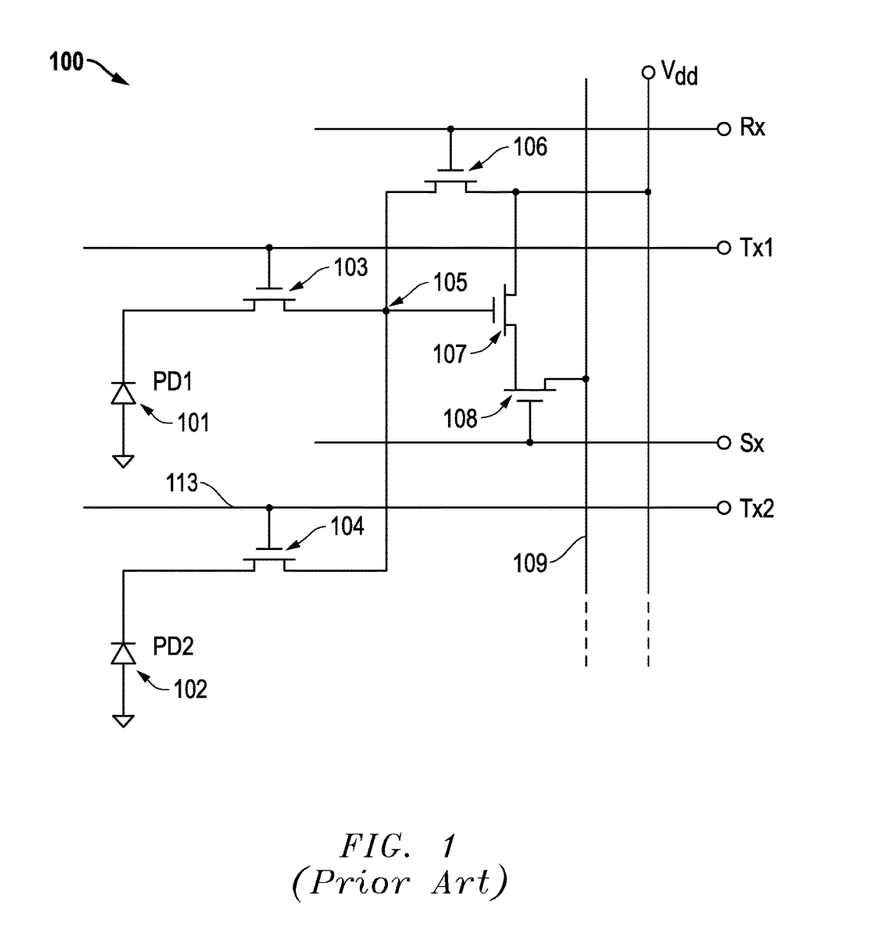
FIG. 1 illustrates a simplified schematic diagram of an active pixel known in the prior art.

FIG. 1 illustrates a simplified schematic diagram of two photodiode pixels 100 known in the prior art. Pixels 100 form a two-way shared photodiode pixel arrangement in an array of many similar pixels forming an image sensor integrated on a single semiconductor substrate. Pixels 100 include PN junction photodiodes 101 and 102, charge transfer transistors 103 and 104, a charge detection node 105 formed as a floating diffusion, transistors 106-108, and a column signal line 109. Photodiode 101 is connected to ground. Photodiode 102 is also connected to ground. Charge transfer transistor 103 is an N-channel metal-oxide-semiconductor (MOS) transistor having a drain connected to charge detection node 105, a gate for receiving a charge transfer signal labeled "$T_{X1}$", and a source connected to photodiode 101. Here and in the following description, all transistors are assumed to be N-channel MOS transistors unless specifically noted. Charge transfer transistor 104 has a drain connected to charge detection node 105, a gate for receiving a transfer signal labeled "$T_{X2}$", and a source connected to photodiode 102. Transistor 106 has a drain connected to a power supply voltage terminal labeled "$V_{dd}$", a gate for receiving a reset signal labeled "$R_X$", and a source connected to charge detection node 105. Transistor 107 has a drain connected to $V_{dd}$, a gate connected to charge detection node 105, and a source connected to the drain of transistor 108. Transistor 108 has a drain connected to the source of transistor 107, a gate for receiving a row selection signal labeled "$S_X$", and a drain connected to column signal line 109.

Photodiodes 101 and 102 share a common charge detection node 105. Reset signal Rx is pulsed high causing reset transistor 106 to become conductive and to set charge detection node 105 to a high voltage bias. After completion of the integration period, charge from the photodiodes is transferred onto charge detection node 105 by charge transfer transistors 103 and 104. Transistor 107 operates as a source follower amplifier to convert charge packets transferred onto charge detection node 105 into a voltage. Signal $S_X$ makes transistor 108 conductive to transfer the voltage signal provided at the source of transistor 107 to column signal line 109. As is known, an image sensor using pixels 100 can sample the reset level on charge detection node 105 and determine the difference between this level and the integrated charge voltage level to reduce or eliminate fixed pattern noise and kTC reset noise, by circuits not shown in FIG. 1.

An image sensor as described herein, however, is formed as a hybrid bonded image sensor that includes both a photodiode chip and a circuit carrying chip. The photodiode chip includes the photodiodes and charge transfer transistors that are connected to charge detection nodes (such as floating diffusions). The circuit carrying chip includes the additional circuits of the image sensor including the charge-to-voltage conversion circuit and may include other circuits such as correlated double sampling (CDS) circuits, analog-to-digital conversion circuits, double reset circuits, and various readout and amplifier circuits. In one example, the photodiode die uses pinned PN junction photodiodes responsive to backside illumination (BSI) to capture photons incident on the backside of the photodiode chip. The two die are attached using chip-to-chip bonding techniques such as hybrid chip stacking (HCS) technology such that the surface of the photodiode chip that carries the bonding pads faces and is electrically connected to the surface of the circuit carrying chip that has the similar bonding pads. By including the charge detection node on the photodiode chip, the capacitance created by the inter-chip bonding is not harmful to pixel operation and may be used for storing charge packets.

Such a hybrid bonded image sensor is illuminated from the back side with the pinned photodiodes integrated on one substrate and the pixel circuits integrated on another that is attached (stacked) below the photodiode carrying chip. The chip-to-chip connections are made at every pixel or a group of pixels sharing the same FD node and the circuit connections are made at the FD node level. This arrangement results in highly efficient photodiode performance with the pixels having a large charge storage capacity and high quantum efficiency. The separation of photodiodes from the additional circuits allows fabrication of the circuit chips with a different technology than the photodiode chips. The circuit fabrication technology can thus be highly optimized for the circuit performance and is not compromised by the requirements related to the efficient operation of the pinned photodiodes. In the same way the photodiode fabrication technology can also be optimized without the compromises imposed on it by the circuit requirements.

Figure 2:
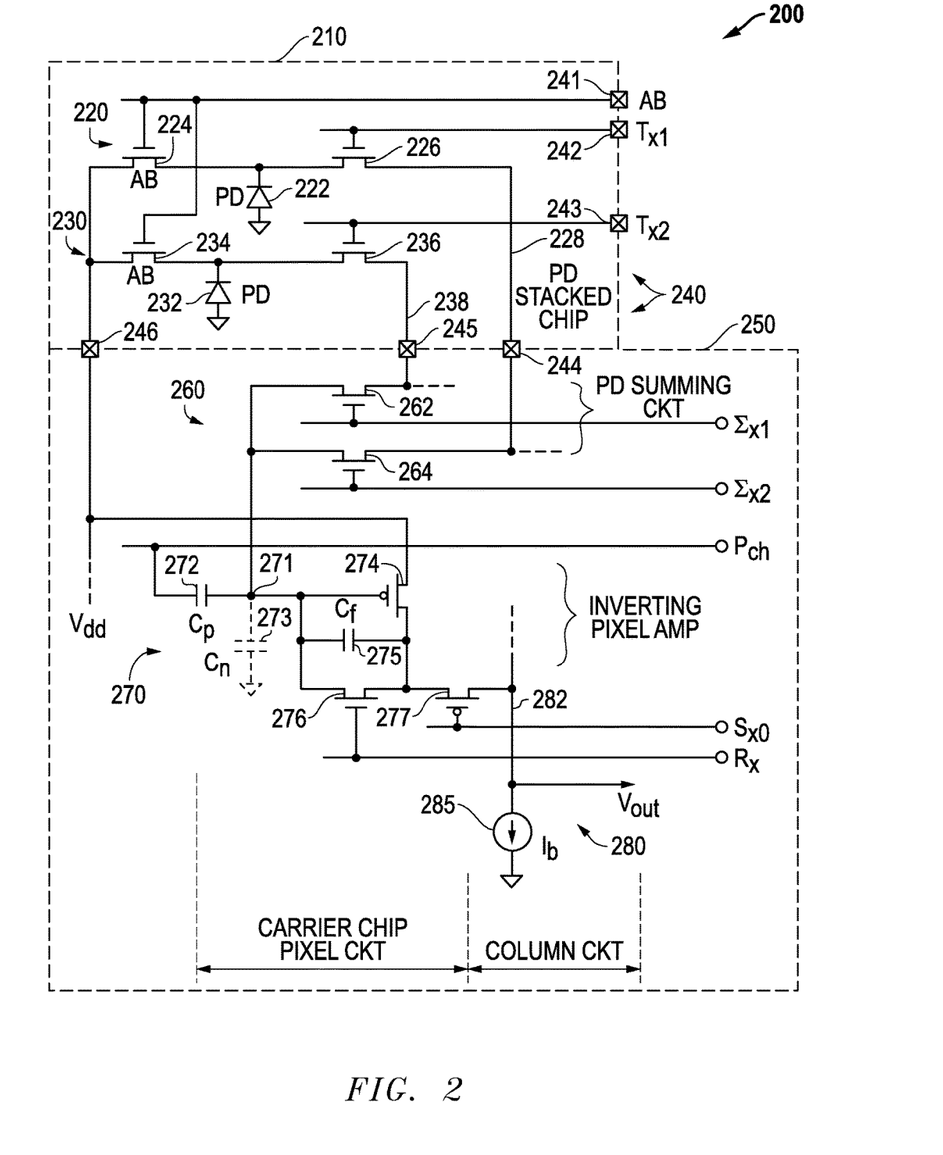
FIG. 2 illustrates a simplified schematic diagram of an image sensor according to one embodiment of the present invention.

FIG. 2 illustrates a simplified schematic diagram of an image sensor 200 according to one embodiment of the present invention. Image sensor 200 is a hybrid bonded image sensor that includes generally a photodiode chip 210 and a circuit carrying chip 250 that are connected by a set of interconnections 240. Photodiode chip 210 includes an array of pixels including representative photodiode pixels 220 and 230. Photodiode pixel 220 includes a photodiode 222 and transistors 224 and 226. Photodiode 222 is referenced to ground. Transistor 224 has a drain, a gate for receiving a signal labeled "AB", and a source connected to photodiode 222. Transistor 226 has a drain connected to photodiode 222, a gate for receiving charge transfer signal $T_{X1}$, and a source connected to a floating diffusion 228. Photodiode pixel 230 includes a photodiode 232 and transistors 234 and 236. Photodiode 232 is referenced to ground. Transistor 234 has a drain, a gate for receiving signal AB, and a source connected to photodiode 232. Transistor 236 has a drain connected to photodiode 232, a gate for receiving transfer signal $T_{X2}$, and a source connected to a floating diffusion 238.

Interconnections 240 include interconnections 241-246. Interconnection 241 is connected to the gates of transistors 224 and 234 and conducts signal AB. Interconnection 242 is connected to the gates of transistors 224 and 234 and conducts signal $T_{X1}$. Interconnection 243 is connected to the gates of transistors 224 and 234 and conducts signal $T_{X2}$. Interconnection 244 is connected to floating diffusion 228. Interconnection 245 is connected to floating diffusion 238. Interconnection 246 is connected to the drains of transistors 224 and 234.

Circuit carrying chip 250 includes a charge summing circuit 260, a pixel amplifier circuit 270, and a column circuit 280. Charge summing circuit 260 includes transistors 262 and 264. Transistor 262 has a drain connected to interconnection 245, a gate for receiving a signal labeled "$\Sigma_{X1}$", and a source. Transistor 264 has a drain connected to interconnection 244, a gate for receiving a signal labeled "$\Sigma_{X2}$", and a source connected to the source of transistors 262 and 264.

Pixel amplifier circuit 270 includes a charge detection node 271, pre-charge capacitor 272 and an equivalent node capacitance 273, a P-channel MOS transistor 274, a capacitor 275, a reset transistor 276, and a P-channel row addressing transistor 277. Capacitor 272 has a first terminal for receiving a signal labeled "$P_{ch}$", and a second terminal connected to charge detection node 271, and has an associated capacitance value labeled "$C_P$". Capacitor 273 is shown in dashed line since it represents an equivalent node capacitance and has a first terminal connected to charge detection node 271, and a second terminal connected to ground, and has an associated capacitance value labeled "$C_n$". Transistor 274 has a source connected to $V_{dd}$, a gate connected to charge detection node 271, and a drain. Capacitor 275 has a first terminal connected to charge detection node 271, and a second terminal connected to the drain of transistor 274 and has an associated capacitance value $C_f$. Transistor 276 has a first source/drain terminal connected to charge detection node 271, a gate for receiving signal Rx, and a second source/drain terminal connected to the drain of transistor 274. Transistor 277 has a source/drain terminal connected to the drain of transistor 274 and to the second source/drain terminal of reset transistor 276, a gate for receiving a signal labeled "$S_{X0}$", and a source/drain connected to a column sense line.

Column circuit 280 includes a column sense line 282 and a current sink 284. Column sense line 282 is connected to the drain of transistor 277 and to the drains of other transistors along this column of the pixel array. Column sense line 282 is connected to the input of a correlated double sampling (CDS) circuit, not shown in FIG. 2. Current sink 284 has a first terminal connected to column sense line 282, and a second terminal connected to ground, and sinks a current labeled "$I_b$".

Image sensor 200 is a hybrid bonded image sensor made up of two integrated circuit chips including photodiode chip 210 having an array of pixels and circuit carrying chip 250 having an array of circuits associated with the array of pixels. These chips are connected via interconnections 240. In one embodiment each of interconnections 240 represent a composite metal stack that includes the pad metal on each chip. These interconnections are made using well known inter-chip bonding techniques.

In this particular embodiment, photodiode chip 210 places the pad metal on a front surface but collects light using backside illumination (BSI). Thus in this example, the chip-to-chip bonding is a special kind known as face-to-face bonding in which the active surfaces of both die face each other.

Photodiode chip 210 includes an array of pixels using photodiodes in which a representative two of them, pixels 220 and 230, are shown in FIG. 2. Photodiodes 222 and 232 are selectively connected to floating diffusions 228 and 238 through charge transfer transistors 226 and 236, respectively. The pixels also include transistors 224 and 234 connected to the photodiodes that operate as anti-blooming/reset transistors and allow charge to be removed to corresponding anti-blooming/reset drains, and are biased at the $V_{dd}$ level supplied from circuit carrying chip 250.

Circuit carrying chip 250 includes the circuit cells that have a switching/summing network placed at their input nodes such as representative charge summing circuit 260 shown in FIG. 2. The switching/summing networks may include several transistors connected to the floating diffusions of corresponding pixels, but for simplicity only two are shown in FIG. 2. Charge summing circuit 260 connects the photodiode FD nodes from the photodiode carrying chip to charge detection node 271 of circuit carrying chip 250. Charge detection node 271 has a representative node capacitance $C_n$ that also represents the parasitic capacitances of the chip-to-chip bonding pad connections. Charge detection node 271 is further connected to the gate of P-channel MOS transistor 274, which serves as an inverting amplifier. An advantage of using P-channel MOS transistor 274 is that it has low random telegraph signal (RTS) noise. In other embodiments, other types of transistors or inverting amplifiers can also be used. Transistor 274 provides a signal output at its drain. Capacitor 275 operates as a feedback capacitor between the drain of transistor 274 and charge detection node 271. Charge detection node 271 is also connected to a capacitor 272 that pre-charges charge detection node 271 by injecting a certain amount of compensating charge to the node when signal $P_{ch}$ is pulsed high. Reset transistor 276 operates as a reset transistor to reset charge detection node 271 in response to an activation of signal $R_X$, and transistor 277 connects the output of pixel amplifier circuit 270 to column sense line 282 in response to the activation of signal $S_{X0}$, which also connects current sink 284 to corresponding amplifiers. The pixel output signal appears on column line 282 and is provided to a column CDS signal processing circuit (not shown in FIG. 2).

A charge readout sequence occurs as follows. Charge summing circuit 260 is configured by activating $\Sigma_{X1}$ and/or $\Sigma_{X2}$ to make transistors 262 and 264, respectively, conductive. Charge summing circuit 260 can be re-configured every time the row is read out, or it can stay configured as is for the whole frame readout time. Next, row select transistor 277 is made conductive and reset transistor 276 is made non-conductive. Next, signal $P_{ch}$ is pulsed high, and the output signal that appears thereafter on column line 282 is sampled and stored in the CDS signal processing circuit and later used as a reset reference. Next, the corresponding row of charge transfer transistors 226 and 236 is activated by pulsing signals $T_{X1}$ and/or $T_{X2}$ high, delivering photodiode charge through charge summing circuit 260 from the selected photodiodes onto charge detection node 271 and momentarily changing its bias level. However, the feedback effect of pixel amplifier circuit 270 almost immediately compensates for this momentary change by providing an inverted output signal to column line 282. The inverted output signal is then sampled by the CDS circuit, which subtracts the previously stored reference to provide a low noise output signal that is substantially free of kTC reset noise and any fixed pattern noise. After further processing of the inverted output signal, the circuits are returned to their original configuration in preparation for reading a signal from the next row of pixels. Thus image sensor 200 operates in a rolling shutter scanning mode.

While the equivalent capacitance $C_n$ on charge detection node 271 is relatively large, the feedback of pixel amplifier circuit 270 compensates for this capacitance and for signal uniformity and low conversion gain. The conversion gain is thus determined only by the value of the feedback capacitance $C_f$, which can be built with a desired value and high uniformity.

In other embodiments, capacitor 275 can be replaced with a variable capacitor that has a low capacitance and thus high conversion gain for low light level signals, and a high capacitance and low conversion gain for the high light level signals. This feature provides in-pixel dynamic range extension by signal voltage swing range compression.

Figure 3:
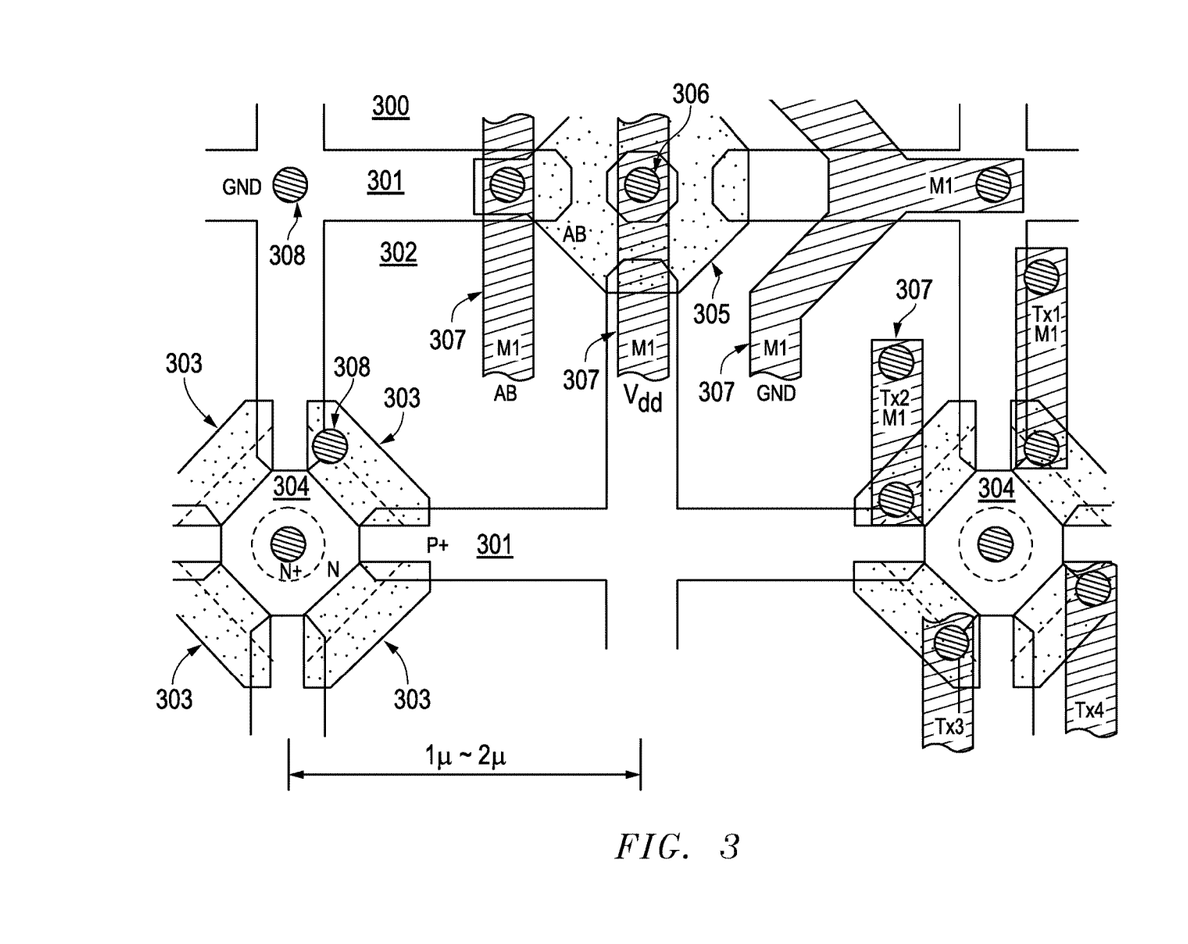
FIG. 3 illustrates a simplified top view of a portion of a photodiode chip that could be used as the photodiode chip of FIG. 2 according to one embodiment.

FIG. 3 illustrates a top view of a portion of a photodiode chip 300 that could be used as image sensor 200 of FIG. 2 according to one embodiment. Photodiode chip 300 includes repeating regions having the same reference numbers that are repeated across the photodiode array, including P+ type doped pixel isolation regions 301, pinned photodiode regions 302 under which charge is accumulated and stored, transfer gate regions 303 for transferring the integrated charge onto floating diffusion (FD) regions 304, anti-blooming gate regions 305, drain regions 306, first level metal (M1) interconnect regions 307, and contact vias 308.

In photodiode chip 300, each FD region 304 and each drain region 306 are shared among four adjacent photodiodes. For example pinned photodiode region 302 includes an N− type doped charge storage region located under it, an example of which will be described below, that also forms the source of a charge transfer transistor whose gate is gate region 303 and which includes a contact via 308 to an overlying charge transfer signal line which not shown in FIG. 3. FIG. 3 illustrates each representative contact via 308 by shaded circles, and the first level of metal interconnects by interconnect regions 307.

Figure 4:
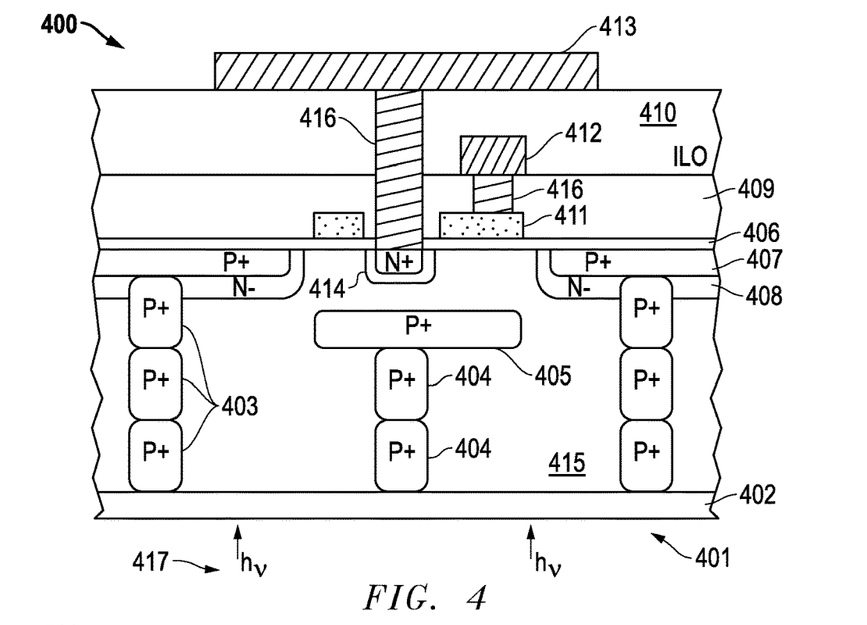
FIG. 4 illustrates a simplified cross sectional view of a portion of the photodiode chip of FIG. 3.

FIG. 4 illustrates a simplified cross sectional view 400 of a portion of photodiode chip 300 of FIG. 3. A P− type doped epitaxial layer 415 has a P+ type doped layer 402 implanted at its back side surface and is formed on a semiconductor substrate 401. Layer 402 serves as a potential pinning layer to reduce the generation of dark current by the silicon-silicon dioxide interface states. Layer 402 is connected to ground through P+ type doped pixel isolation regions 403 that are connected to a top P+ photodiode pinning layer 407. Pinning layer 407 is connected to ground by via and metal interconnects, not shown in FIG. 4. The ground contact to the p+ type doped layer 405 that is located under transfer gate 411 and under an FD region 414 is provided from layer 402 through P+ implanted regions 404. Transfer gate 411 is isolated from the substrate by a thin gate oxide layer 406. Charge is stored in the pinned photodiode region formed by the N− type doped region 408 and the P+ type doped region 407, which serves as a photodiode pinning layer. An additional inter-level oxide (ILO) layer 409 is deposited over transfer gate 411. Transfer gate 411 is connected through via 416 to the first metal level interconnects 412. Additional ILO layer 410, deposited over the first metal layer, provides isolation for the second metal level interconnects, not shown in FIG. 4. Finally, via 416 extends through ILO layers 409 and 410 to connect FD region 414 to chip-to-chip bonding pad 413. Photons 417 enter this photodiode structure from the back side of semiconductor substrate 401 to generate electrons that are then stored in the pinned photodiode N− type doped regions 408 where they wait for readout.

Figure 5:
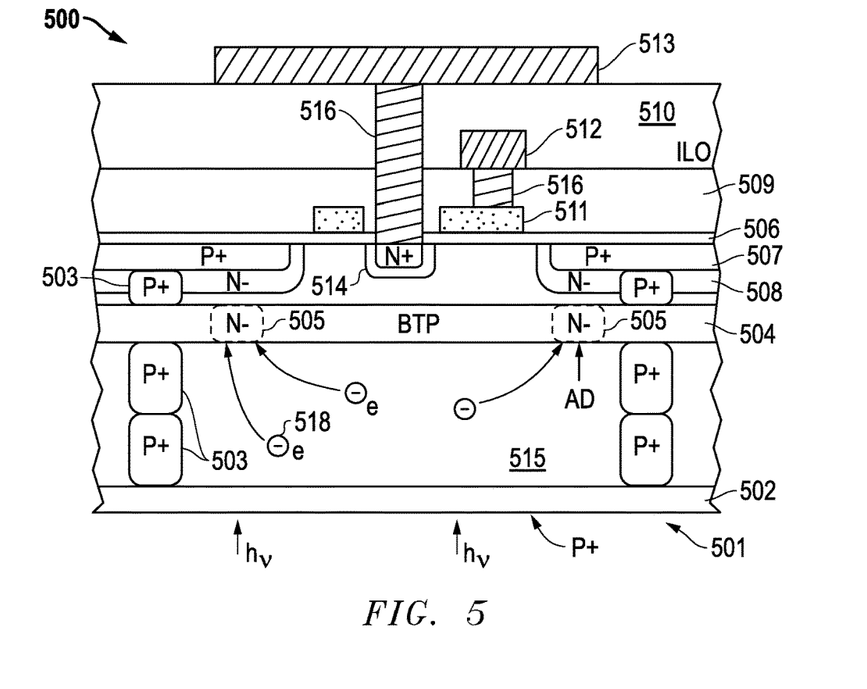
FIG. 5 illustrates a simplified cross sectional view of a portion of a photodiode chip that could be used as the photodiode chip of FIG. 2 according to another embodiment.

FIG. 5 illustrates a cross sectional view of a portion of a photodiode chip that could be used as the photodiode chip of FIG. 2 according to another embodiment. A P− type doped epitaxial layer 515 has a P+ type doped layer 502 implanted at its back side surface and is formed on a semiconductor substrate 501. Layer 502 serves as a potential pinning layer to reduce the generation of dark current by the silicon-silicon dioxide interface states, and is connected to ground through P+ type doped pixel isolation regions 503. A photodiode pinning region 507 is connected to ground by via and metal interconnects (not shown in this drawing). The ground contact to the P+ type doped (BTP) layer 504, which spans the whole pixel area including a transfer gate 511 and an FD region 514, is provided from P+ type doped pixel isolation regions 503. BTP layer 504 has N− type doped openings 505 in it to provide a path for electrons 518 generated by photons 517 to flow from the bulk into N− typed doped region 508 that operate as pinned photodiode regions where they are stored waiting for readout. Transfer gate 511 is isolated from the substrate by a thin gate oxide layer 506. Charge is stored in a pinned photodiode region, as already mentioned, formed by the N− typed doped region 508 and P+ type doped pinning region 507. An additional ILO layer 509 is deposited over transfer gate 511. Transfer gate 511 is connected through via 516 to M1 interconnect 512. An additional ILO level 510, deposited over M1, provides isolation for the second metal level (M2) interconnects (not shown in FIG. 5). Finally, via 516 through all ILO levels deposited over the metal interconnects provides a connection to a chip-to-chip bonding pad 513 from FD region 514. (what is PT in the drawing?)

Those of ordinary skill in the art would appreciate that there are many other examples of how to construct the photodiodes in a photodiode chip without the use of source follower transistors, reset transistors, and addressing transistors that are typically integrated with them. It should also be understood that the photodiodes integrated on the photodiode chip may have various color filter arrays with micro lenses deposited on their back side. Moreover the photodiodes on the photodiode chip can receive image illumination through various color filter arrays with micro lenses which are illuminated by various optical image projection means.

Figure 6:
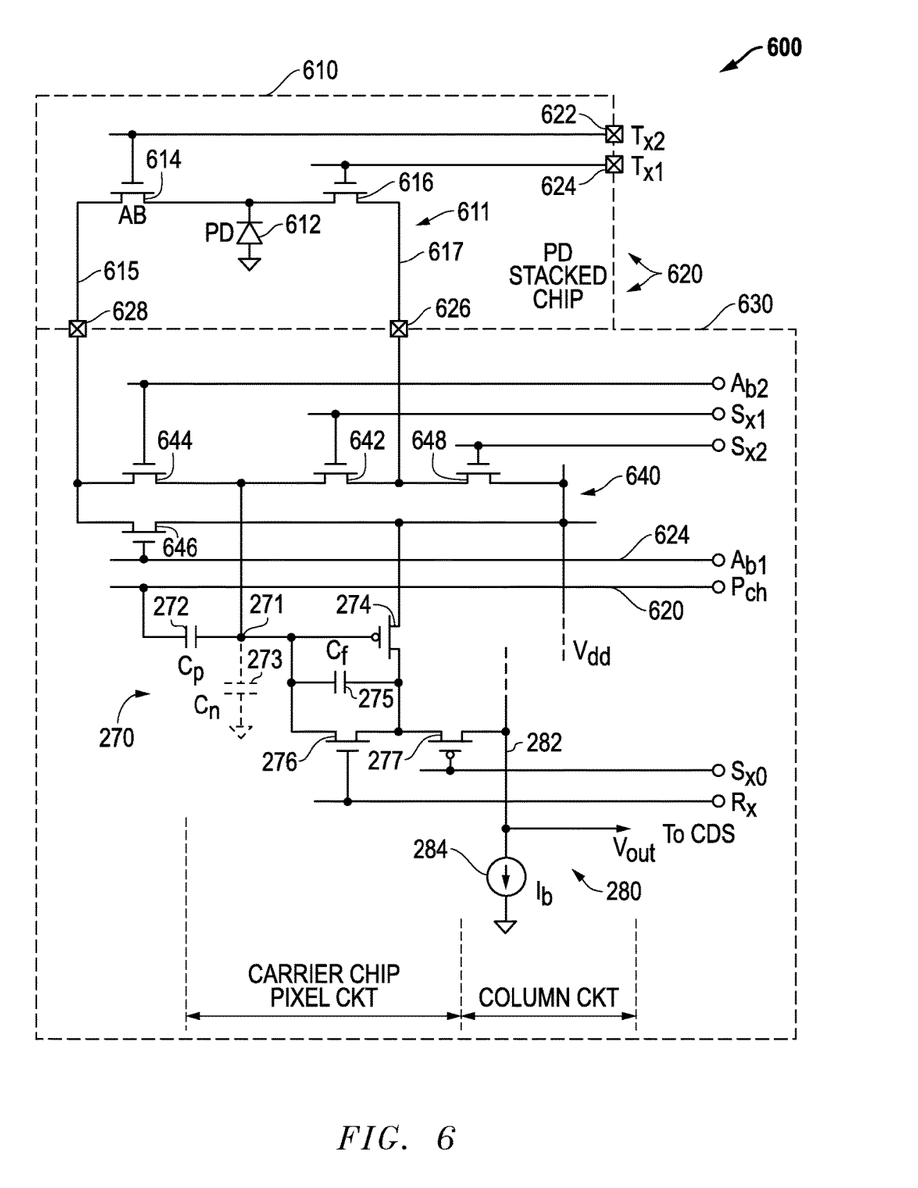
FIG. 6 illustrates a simplified schematic diagram of a hybrid bonded image sensor suitable for operation in the rolling shutter scanning mode according to another embodiment of the present invention.

FIG. 6 illustrates in a simplified schematic diagram of a hybrid bonded image sensor 600 suitable for operation in the rolling shutter mode according to another embodiment of the present invention. Image sensor 600 includes generally a photodiode chip 610 and a circuit carrying chip 630 that are connected by a set of interconnections 620.

Photodiode chip 610 includes an array of pixels including a single representative pixel 611 shown in FIG. 6. Pixel 611 includes a photodiode 612 and transistors 614 and 616. Photodiode 612 is referenced to ground. Transistor 614 has a drain connected to photodiode 612, a gate for receiving charge transfer signal labeled "$T_{X2}$", and a source connected to a diffusion 615. Transistor 616 has a drain connected to the photodiode 612, a gate for receiving charge transfer signal $T_{X1}$, and a source connected to floating diffusion 617.

Interconnections 620 include interconnections 622, 624, 626, and 628. Interconnection 622 is connected to the gate of transistor 614 and conducts signal $T_{X2}$. Interconnection 624 is connected to the gates of transistor 616 and conducts signal $T_{X1}$. Interconnection 626 is connected to floating diffusion 617. Interconnection 628 is connected to diffusion 615.

Circuit carrying chip 630 includes an array of switching networks 640, and pixel amplifier circuit 270 and column circuit 280 as previously described above. Switching network 640 includes transistors 642, 644, 646, and 648. Transistor 642 has a drain connected to interconnection 626, a gate for receiving a signal labeled "$S_{X1}$", and a source connected to charge detection node 271. Transistor 644 has a drain connected to interconnection 628, a gate for receiving a signal labeled "$S_{X2}$", and a source connected to charge detection node 271. Transistor 646 has a drain connected to Vdd, a gate for receiving a signal labeled "$A_{b1}$", and a source connected to interconnection 628. Transistor 648 has a drain connected to Vdd, a gate for receiving a signal labeled "$A_{b2}$", and a source connected to interconnection 626.

Image sensor 600 again includes a photodiode chip 610 having an array of pixels and a circuit carrying chip 630 having an array of circuits associated with the array of pixels that are connected by a set of interconnections 620. Photodiode 612 is connected by transistors 614 and 616 (missing label) to corresponding diffusions 615 and 617 which are in turn connected to corresponding interconnections 628 and 626. Signals $T_{X2}$ and $T_{X1}$ are row select signals that are applied to the gates of respective transistors 614 and 616. In this embodiment, circuit carrying chip 630 includes switching network 640 such that the charge signal can be extracted either from the individual floating diffusions belonging to each photodiode region or from the anti-blooming drains that are already common to four photodiodes. Image sensor 600 thus automatically realizes charge summing from the neighboring 2×2 photodiodes. Transistors 642, 644, 646, and 648 are controlled by signals SX1, SX2, Ab1, and Ab2, respectively, to allow the floating diffusions and the anti-blooming drains to reverse roles. Switching network 640 delivers the desired signal to charge detection node 271 for sensing by pixel amplifier circuit 270 as described above. The operation of pixel amplifier circuit 270 and column circuit 280 operate as described above.

Figure 7:
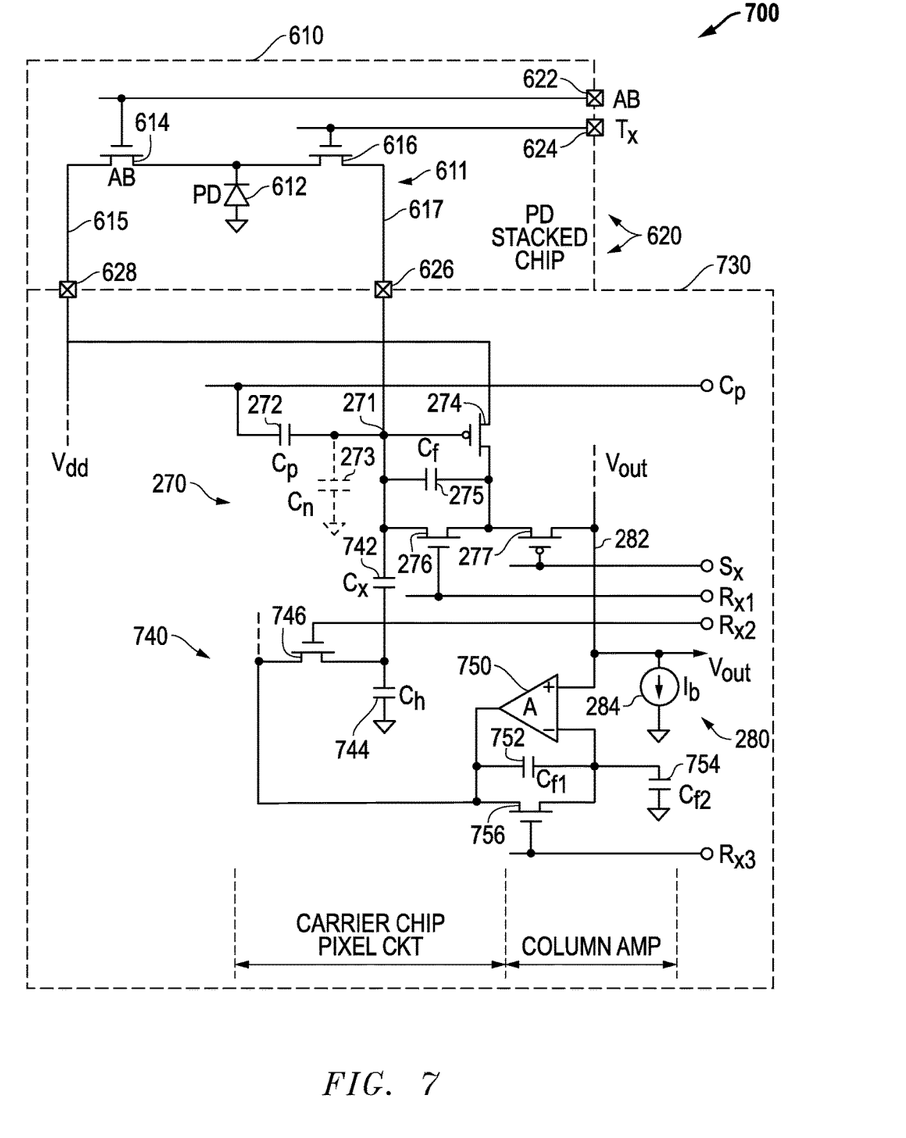
FIG. 7 illustrates a simplified schematic diagram a hybrid bonded image sensor suitable for operation in the global shutter scanning mode according to yet another embodiment of the present invention.

FIG. 7 illustrates in a simplified schematic diagram of a hybrid bonded image sensor 700 suitable for operation in the global shutter scanning mode according to yet another embodiment of the present invention. Image sensor 700 includes generally photodiode stacked chip 610 as described above and a circuit carrying chip 730 that are connected by a set of interconnections 620.

Photodiode chip 610 is constructed the same as described with reference to FIG. 6 above. However in image sensor 700, interconnection 622 receives a single anti-blooming signal AB, and interconnection 624 receives a single transfer signal $T_X$ (what is 611?)

Interconnections 620 include interconnections 622, 624, 626, and 628. Interconnection 622 is connected to the gate of transistor 614 and conducts signal AB. Interconnection 624 is connected to the gate of transistor 616 and conducts signal $T_X$. Interconnection 626 is connected to floating diffusion 617. Interconnection 628 is connected to diffusion 615.

Circuit carrying chip 730 includes pixel amplifier circuit 270 and column circuit 280 as previously described above and additionally a double reset circuit 740. Charge detection node 271 of pixel amplifier circuit 270 is connected to interconnection 626 and circuit carrying chip 730 provides $V_{dd}$ to interconnection 628, whereas the drain of transistor 277 is connected to column sense line 282 as described above. Double reset circuit 740 includes capacitors 742 and 744, a transistor 746, a differential amplifier 750, a capacitor 752, a capacitor 754, and a transistor 756. Capacitor 742 has a first terminal connected to charge detection node 271, and a second terminal connected to the source of transistor 746, and has an associated capacitance value labeled "$C_X$". Capacitor 744 has a first terminal connected to the second terminal of capacitor 742, and a second terminal connected to ground, and has an associated capacitance value labeled "$C_h$". Transistor 746 has a drain, a gate for receiving a signal labeled "$R_{x2}$", and a source connected to the second terminal of capacitor 742 and the first terminal of capacitor 744. Amplifier 750 has a non-inverting input terminal connected to column sense line 282, an inverting input terminal, and an output terminal connected to the drain of transistor 746. Capacitor 752 has a first terminal connected to the inverting input terminal of differential amplifier 750, and a second terminal connected to the output terminal of differential amplifier 750 and has an associated capacitance value labeled "$C_{f1}$". Capacitor 754 has a first terminal connected to the inverting input terminal of differential amplifier 750, and a second terminal connected to ground, and has an associated capacitance value labeled "$C_{f2}$". Transistor 756 has a first source/drain terminal connected to the inverting input terminal of differential amplifier 750, a gate for receiving a signal labeled "$R_{x3}$", and a second source/drain terminal connected to the output terminal of differential amplifier 750.

Image sensor 700 uses circuit carrying chip 730 instead of circuit carrying chip 630 of FIG. 6 to facilitate operation in the global shutter scanning mode. The global shutter scanning mode is realized by storing signal charge on FD 617, which is connected to charge detection node 271 via interconnection 626. Charge is transferred onto charge detection node 271 and all similar nodes in photodiode chip 610 after all the photodiodes have been globally accessed and all the transfer gates such as transistor 616 have been simultaneously pulsed. During sensing, pixel amplifier circuit 270 and column circuit 280 operate as described above.

Since charge that was globally transferred out of photodiode 612 is stored on the charge detection node 271 and is read out from charge detection node 271 in a sequential manner row by row, it is important that charge detection node 271 is reset to precisely the same level after the signal has been read out and sampled by the CDS signal processing circuits. However using the standard reset would introduce an undesirable kTC noise contribution into the signal. Thus circuit carrying chip 730 uses a double reset technique to provide this precise reset capability.

The operation of the double reset technique proceeds as follows. After the sensing and sampling of signals by the column CDS circuit (not shown in FIG. 7), reset transistor 276 is activated to remove signal charge from charge detection node 271. However this reset operation introduces residual kTC reset noise onto charge detection node 271. The column feedback formed by transistor 277 and double reset circuit 740 senses and inverts this residual noise signal and provides the inverted residual noise signal onto charge detection node 271 through transistor 746 and capacitor 742. This negative feedback thus substantially compensates for the reset error caused by resetting the charge detection node 271 using the reset transistor 276. The reset error compensating voltage is stored on capacitor 744 and similar capacitors in each pixel of circuit carrying chip 730.

Subsequently transistor 746 is turned off, which introduces a new kTC reset error voltage on capacitor 744, but this capacitor can be made relatively large so that the final reset error introduced on charge detection node 271, after division by a capacitor divider formed by capacitors 742 and 744, is negligible. The gain of differential amplifier 750 controls the amount of column feedback, which also depends on the values of capacitances $C_{f1}$ and $C_{f2}$. Transistor 756 resets differential amplifier 750 every time a line is read out to establish a correct reset reference at each addressed row. Transistor 746 is activated by signal $R_{x2}$, whereas transistor 756 is reset by signal $R_{x3}$.

Note that storing charge on floating diffusion 715 and transferring charge to charge detection node 271 generates leakage current due to the diffusions, and it is important to carefully design these nodes to reduce leakage current.

While circuit carrying chip 730 uses a switched capacitor amplifier, in other embodiments other types of operational amplifiers can be used. Moreover in other embodiments, dynamic range can be selectively extended by incorporating a variable-voltage controlled feedback capacitor in place of capacitor 275.

Figure 8:
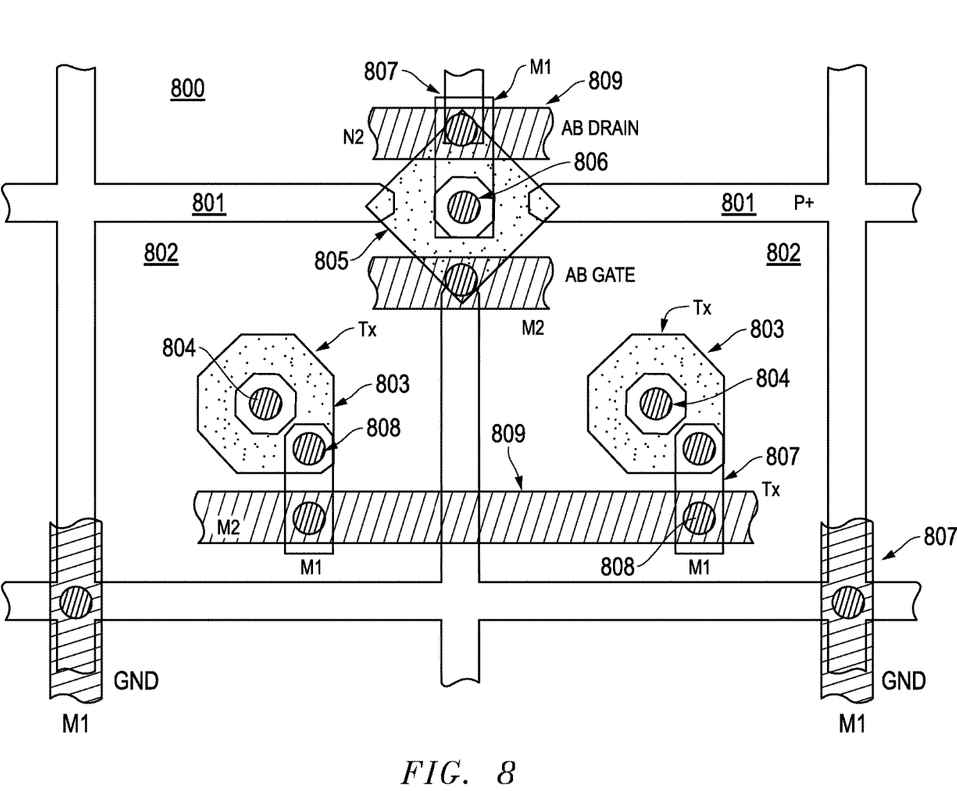
FIG. 8 illustrates a simplified top view of a portion of a photodiode chip that could be used as the photodiode chip of FIG. 2 according to another embodiment.

FIG. 8 illustrates a top view of a portion of a photodiode chip 800 that could be used as photodiode chip 610 of FIG. 7 according to another embodiment. Photodiode chip 800 includes repeating regions having the same reference numbers that are repeated across the photodiode array, including p+ type doped pixel isolation regions 801, pinned photodiode regions 802 under which charge is accumulated and stored, transfer gate regions 803 for transferring the integrated charge onto FD regions 804, anti-blooming gate regions 805, anti-blooming drain regions 806, first level metal (M1) interconnect regions 807, and contact via regions 808.

Each drain region 806 is shared among four adjacent photodiodes. The N-type doped region under the pinned photodiode region 802 forms the source of a charge transfer transistor whose gate is transfer gate region 803 which includes a contact via region 808 to an overlying charge transfer signal line. FD regions 804 are located approximately in the centers of the pixel pinned photodiode regions 802. FIG. 8 illustrates contact via regions 808 by representative shaded circles, and the first level of metal interconnects by regions 807, and second level of metal (M2) 809.

Charge transfer gate regions 803 transfer accumulated charge onto the FD regions 804 simultaneously for all the pixels of the array to realize the Global Shutter scanning mode operation. Charge overflow and charge reset are controlled by anti-blooming gate regions 805 with anti-blooming drain regions 806 that are shared among the four adjacent photodiodes and are biased to $V_{dd}$.

The layout of photodiode chip array 800 is thus simple and efficient with no shallow trench isolation (STI) regions and no circuit transistors that would consume a valuable photodiode pixel area. Connection to the circuit carrying chip 730 is realized by the metal pads formed on the third metal level (not shown in FIG. 8) that are also connected to FD regions 804 by a corresponding via. The second metal level connections are the regions 809.

Thus, a hybrid bonded image sensor uses stacked chip technology with a photodiode chip that carries only the photodiodes and corresponding charge transfer gates but with no circuit transistors, stacked with and electrically and mechanically bonded to a circuit carrying chip by hybrid chip stacking technology. The interconnection point between the photodiode chip and the circuit carrying chip is the floating diffusion/charge detection nodes, which operate well even with the added capacitance formed by the chip-to-chip connection. Moreover in various configurations the image sensor can be operated with both rolling shutter and a global shutter scanning modes.

The above-disclosed subject matter is to be considered illustrative, and not restrictive, and the appended claims are intended to cover all such modifications, enhancements, and other embodiments that fall within the true scope of the claims. For example in other embodiments, the conductivity type of the semiconductor substrate, photodiode, and transistors can be reversed Moreover the image sensor and image processing system can be used to increase the dynamic range of a variety of different electronic products by selecting an appropriate feedback capacitance for the amplifier.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A hybrid bonded image sensor comprising:
   a photodiode chip providing charge to a first floating diffusion in response to incident light, wherein said first floating diffusion is coupled to a first terminal on a first surface of said photodiode chip;
   a circuit carrying chip having a first terminal aligned with said first terminal of said photodiode chip, said circuit carrying chip forming an output voltage based on charge transferred on said first floating diffusion sensed from said first terminal thereof; and
   an interconnection connecting said first terminal of said photodiode chip to said first terminal of said circuit carrying chip,
   wherein said circuit carrying chip forms said output voltage using an amplifier coupled to said first floating diffusion through a charge detection node, and said amplifier comprises:
   a first transistor having a first current electrode coupled to a reference voltage, a control electrode coupled to said charge detection node, and a second current electrode;
   a capacitor having a first terminal coupled to said charge detection node, and a second terminal coupled to said second current electrode of said first transistor; and
   a second transistor having a first current electrode coupled to said second current electrode of said first transistor, a control electrode for receiving a select signal, and a second current electrode for providing said output voltage.

2. The hybrid bonded image sensor of claim 1 wherein:
   said photodiode chip further provides charge to said first floating diffusion in response to light incident upon a first photodiode;
   said photodiode chip further provides charge to a second floating diffusion in response to light incident upon a second photodiode, wherein said second floating diffusion is coupled to a second terminal on said first surface of said photodiode chip;
   said circuit carrying chip further has a second terminal aligned with said second terminal of said photodiode chip; and
   said circuit carrying chip comprises a charge summing circuit coupled between said first and second terminals of said circuit carrying chip and an input of said amplifier.

3. The hybrid bonded image sensor of claim 1 wherein:
   said photodiode chip further provides charge to selected ones of said first floating diffusion and a second floating diffusion in response to incident light upon a photodiode, wherein said second floating diffusion is coupled to a second terminal on said first surface of said photodiode chip;
   said circuit carrying chip further has a second terminal aligned with said second terminal of said photodiode chip; and
   said circuit carrying chip comprises a charge summing circuit coupled between said first and second terminals of said circuit carrying chip and an input of said amplifier.

4. The hybrid bonded image sensor of claim 1 wherein said amplifier comprises an inverting amplifier using negative capacitive feedback.

5. The hybrid bonded image sensor of claim 1 wherein said first and second transistors comprise P-channel MOS transistors.

6. The hybrid bonded image sensor of claim 1 wherein said capacitor has a variable capacitance.

7. A hybrid bonded image sensor comprising:
   a photodiode chip formed in a first semiconductor substrate comprising a plurality of pixels, each pixel comprising a photodiode coupled to a floating diffusion through corresponding charge transfer transistor, said floating diffusion coupled to a terminal on a first surface of said first semiconductor substrate;
   a circuit carrying chip formed in a second semiconductor substrate and having a plurality of terminals aligned with corresponding terminals of said photodiode chip, said circuit carrying chip forming output voltages based on charge transferred on said plurality of floating diffusions sensed from corresponding terminals on said circuit carrying chip; and
a plurality of interconnections connecting terminals of said photodiode chip to corresponding terminals of said circuit carrying chip for each of said plurality of pixels,
wherein said circuit carrying chip comprises a pixel amplifier circuit having an input coupled to one of said plurality of floating diffusions through a charge detection node, and an output, and is responsive to charge transferred on said charge detection node to provide a first output voltage, and said pixel amplifier circuit comprises:
a first transistor having a first current electrode coupled to a reference voltage, a control electrode coupled to said charge detection node, and a second current electrode;
a capacitor having a first terminal coupled to said charge detection node, and a second terminal coupled to said second current electrode of said first transistor; and
a second transistor having a first current electrode coupled to said second current electrode of said first transistor, a control electrode for receiving a select signal, and a second current electrode for providing said first output voltage.

8. The hybrid bonded image sensor of claim 7 wherein:
said photodiode chip further provides charge to a first floating diffusion in response to light incident upon a first photodiode;
said photodiode chip further provides charge to a second floating diffusion in response to light incident upon a second photodiode, wherein said second floating diffusion is coupled to a second terminal on said first surface of said photodiode chip;
said circuit carrying chip further has a second terminal aligned with said second terminal of said photodiode chip; and
said circuit carrying chip comprises a charge summing circuit coupled between first and second terminals of said circuit carrying chip and an input of said pixel amplifier circuit.

9. The hybrid bonded image sensor of claim 7 wherein:
said photodiode chip further provides charge to selected ones of a first floating diffusion and a second floating diffusion in response to incident light upon a photodiode, wherein said first and second floating diffusions are coupled to corresponding terminals on said first surface of said photodiode chip; and
said circuit carrying chip comprises a charge summing circuit coupled between said corresponding terminals of said circuit carrying chip and said input of said pixel amplifier circuit.

10. The hybrid bonded image sensor of claim 7 wherein said first and second transistors comprise P-channel MOS transistors.

11. The hybrid bonded image sensor of claim 7 wherein said capacitor has a variable capacitance.

12. The hybrid bonded image sensor of claim 7 wherein said pixel amplifier circuit further comprises:
a third transistor having a first current electrode coupled to said charge detection node, a control electrode for receiving a reset signal, and a second current electrode coupled to said second current electrode of said first transistor.

13. The hybrid bonded image sensor of claim 12 wherein said first and second transistors comprise P-channel MOS transistors and said third transistor comprises an N-channel MOS transistor.

14. The hybrid bonded image sensor of claim 7 wherein said pixel amplifier circuit comprises:
a pre-charge circuit responsive to a pre-charge signal to pre-charge said charge detection node by a predetermined amount of charge.

15. The hybrid bonded image sensor of claim 7 wherein said first surface of said first semiconductor substrate comprises a front surface, and said photodiode chip provides charge to said floating diffusion based on light received on a back surface of said first semiconductor substrate.

16. A method comprising:
detecting incident light using a photodiode chip to create photocharge;
transferring said photocharge onto a floating diffusion of said photodiode chip;
coupling said floating diffusion to an input of a circuit carrying chip using hybrid chip stacking (HCS) interconnect technology; and
forming an output voltage on said circuit carrying chip based on said photocharge transferred onto said floating diffusion, wherein said forming comprises forming said output voltage on said circuit carrying chip using an amplifier coupled to said floating diffusion through a charge detection node, comprising:
a first transistor having a first current electrode coupled to a reference voltage, a control electrode coupled to said charge detection node, and a second current electrode;
a capacitor having a first terminal coupled to said charge detection node, and a second terminal coupled to said second current electrode of said first transistor; and
a second transistor having a first current electrode coupled to said second current electrode of said first transistor, a control electrode for receiving a select signal, and a second current electrode for providing said output voltage.

17. The method of claim 16 wherein:
said detecting said incident light comprises detecting said incident light using a backside of said photodiode chip, and said coupling said floating diffusion to said input of said circuit carrying chip comprises coupling said floating diffusion to said input of said circuit carrying chip over a front surface of said photodiode chip.

18. The method of claim 16 wherein:
said forming said output voltage on said circuit carrying chip comprises amplifying a voltage signal generated from said photocharge on said floating diffusion using an inverting pixel amplifier and negative feedback.

19. The method of claim 16, wherein said forming further comprises using a P-channel MOS transistors as said first and second transistors.

20. The method of claim 16, wherein said forming further comprises using a variable capacitor as said capacitor.

* * * * *